(12) United States Patent
Krumrey et al.

(10) Patent No.: US 7,465,987 B2
(45) Date of Patent: Dec. 16, 2008

(54) FIELD ELECTRODE TRENCH TRANSISTOR STRUCTURE WITH VOLTAGE DIVIDER

(75) Inventors: Joachim Krumrey, Goedersdorf (AT); Franz Hirler, Isen (DE); Walter Rieger, Arnoldstein (AT)

(73) Assignee: Infineon Technologies Austria AG, Villach (AT)

( * ) Notice: Subject to any disclaimer, the term of this patent is extended or adjusted under 35 U.S.C. 154(b) by 10 days.

(21) Appl. No.: 11/468,994

(22) Filed: Aug. 31, 2006

(65) Prior Publication Data
US 2007/0085136 A1    Apr. 19, 2007

(30) Foreign Application Priority Data
Aug. 31, 2005    (DE)    ................... 10 2005 041 257

(51) Int. Cl.
*H01L 27/108*    (2006.01)
(52) U.S. Cl. .................. 257/330; 257/331; 257/332; 257/333; 257/334; 257/E29.201

(58) Field of Classification Search ......... 257/330–334, 257/E29.201
See application file for complete search history.

(56) References Cited

U.S. PATENT DOCUMENTS
2005/0082591 A1 *    4/2005    Hirler et al. ................. 257/302

FOREIGN PATENT DOCUMENTS
DE    10014660 C2    8/2002
DE    10297349 T5    1/2005

* cited by examiner

*Primary Examiner*—Evan Pert
*Assistant Examiner*—Tan N Tran
(74) *Attorney, Agent, or Firm*—Dicke, Billig & Czaja, PLLC

(57)    ABSTRACT

A trench transistor structure having a field electrode arrangement formed in trenches is disclosed. In one embodiment, the field electrode arrangement is conductively connected to sub-voltage taps of a voltage divider for the purpose of stabilizing the potentials on a longer time scale than dynamic charge reversal processes.

18 Claims, 7 Drawing Sheets

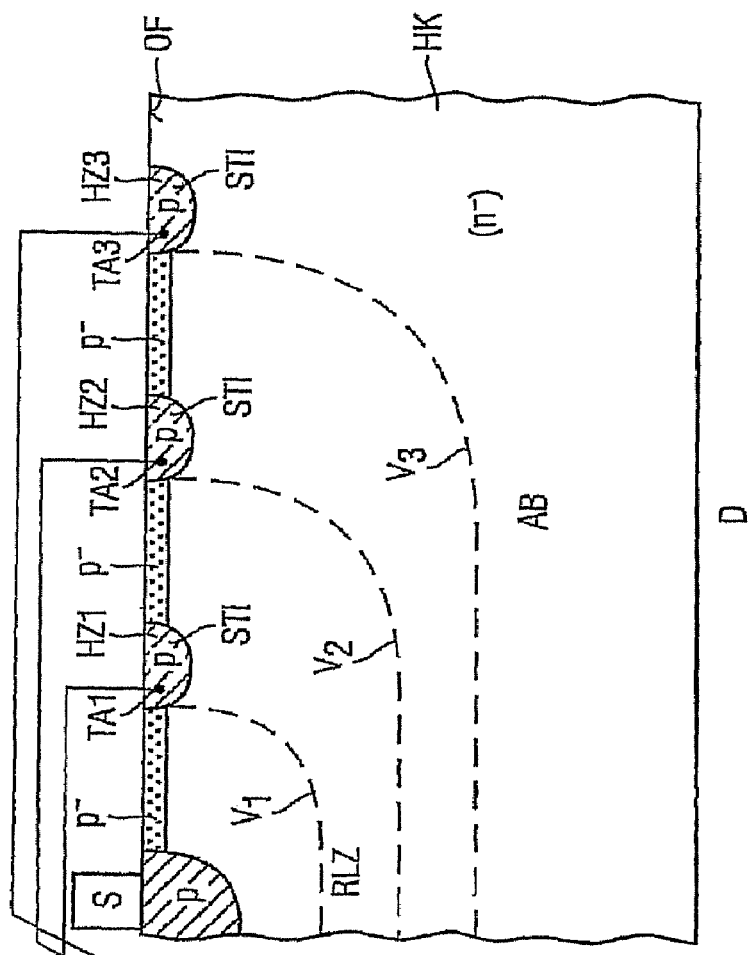
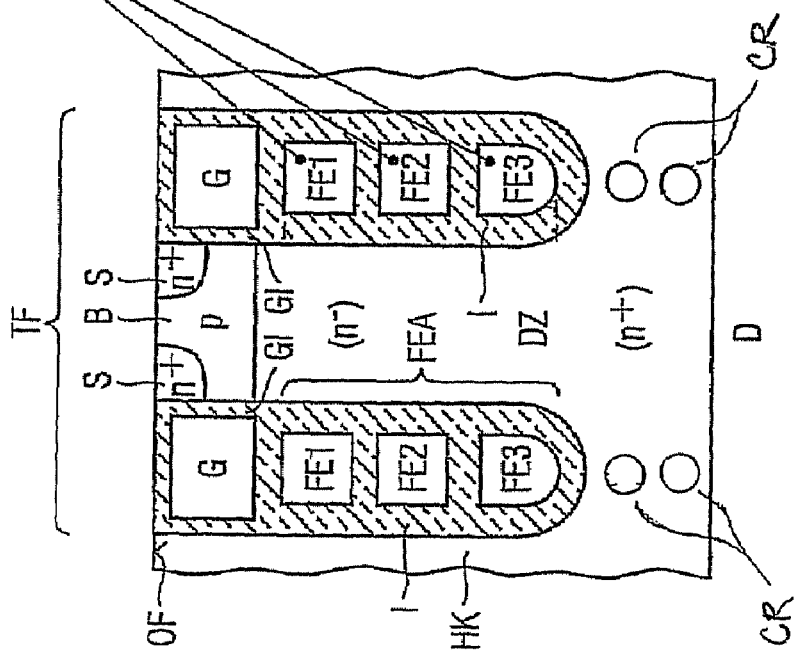

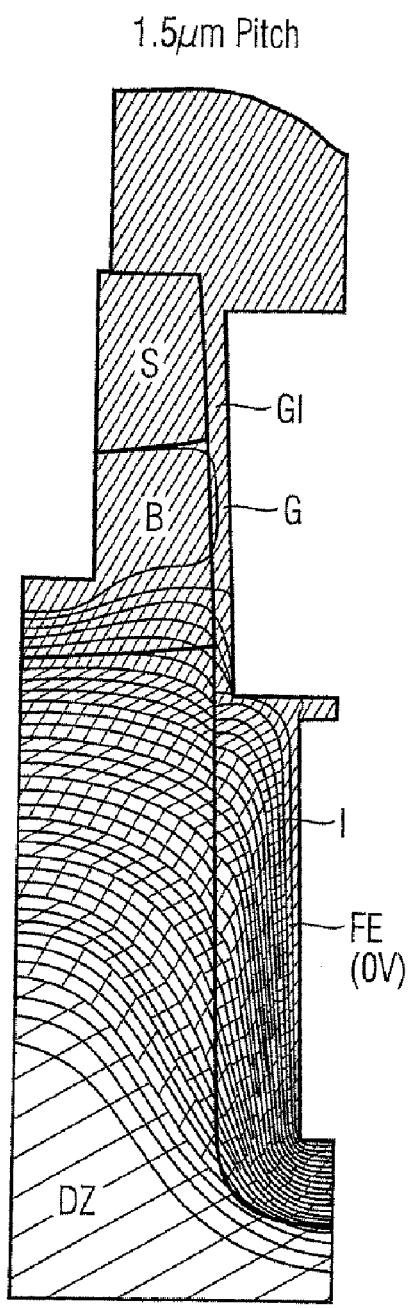
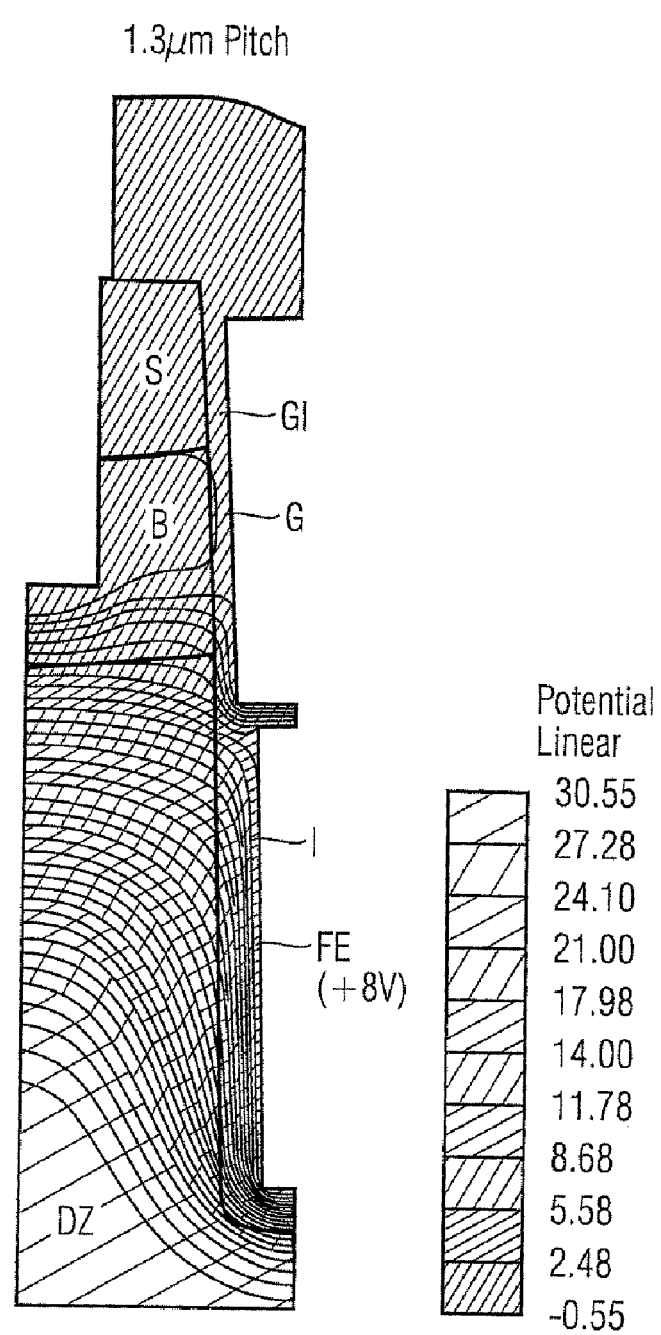

US 7,465,987 B2

FIELD ELECTRODE TRENCH TRANSISTOR STRUCTURE WITH VOLTAGE DIVIDER

CROSS-REFERENCE TO RELATED APPLICATIONS

This Utility Patent Application claims priority to German Patent Application No. DE 10 2005 041 257.2 filed on Aug. 31, 2005, which is incorporated herein by reference.

BACKGROUND

The invention relates to a trench transistor structure.

The development of DMOS (double diffused metal oxide semiconductor) or MOS (metal oxide semiconductor) field effect transistors is fundamentally driven by the minimization of the surface area specific resistance $R_{on} \cdot A$, since this allows an increase in the static power loss in the turned-on state and hence in the maximum continuous current-carrying capability.

In the case of a DMOS trench transistor structure, trenches spaced by mesa regions define a cell array of trench transistors. The surface area of a transistor cell is therefore made up of a portion of the mesa region and a portion of the trench. In the case of the trench transistors, the mesa region usually contains a source region embedded in a body region of the opposite conductivity type, the body region being formed above a drain region and drift region of the trench transistor. The conductivity in a channel region adjoining the trench in the body region is controlled using a gate electrode which is in a form insulated from the mesa region in the trench.

One possibility for reducing the surface area specific turn-on resistance $R_{on} \cdot A$ is provided by reducing the dimensions of a transistor cell, i.e. the spacing (also called pitch) between adjacent transistor cells. The pitch can be reduced by narrowing the trench and/or alternatively the mesa region. In the case of DMOS trench transistor structures with a field electrode arrangement, however, the width of the trench is determined essentially by the thickness of a field oxide in the trench, said field oxide insulating the field electrode from the drift zone. The thickness of the field oxide is defined essentially by the voltage drop which is to be expected across it, and becomes greater as the voltage drop increases.

DE 10339455 discloses the practice of connecting one or more field electrodes to such fixed potentials that the voltage drop to be expected across the field oxide is reduced and said field oxide can therefore be in a thinner form without having to accept losses in the withstand voltage of the transistor structure and the service life of the field oxide.

Further patent applications submitted to the German Patent and Trademark Office by the applicant on the date of this application propose allowing the field plates in the trench to float in order thus to achieve the advantages of a thinner field oxide which have been described above.

However, floating field electrodes entail problems with regard to long term stability. Inhomogeneities in the insulation structure between adjacent field electrodes mean that leakage currents can flow between the field electrodes, particularly at high temperatures, as a result of which individual field electrodes can adopt undefined potentials. This results in the loss of blocking capability in the trench transistor structure and hence in failure of the application.

For these and other reasons, there is a need for the present invention.

SUMMARY

The invention provides a trench transistor structure having a field electrode arrangement formed in trenches. In one embodiment of the invention, the field electrode arrangement is conductively connected to subvoltage taps of a voltage divider for the purpose of stabilizing the potentials on a longer time scale than dynamic charge reversal processes.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 illustrates a schematic cross-sectional view of an embodiment with floating semiconductor zones as voltage divider elements.

FIG. 4 illustrates schematic cross-sectional views of one half of a trench transistor cell and also of a transistor cell with a voltage divider based on the invention with simulated potential distribution.

DETAILED DESCRIPTION

Figure 1:
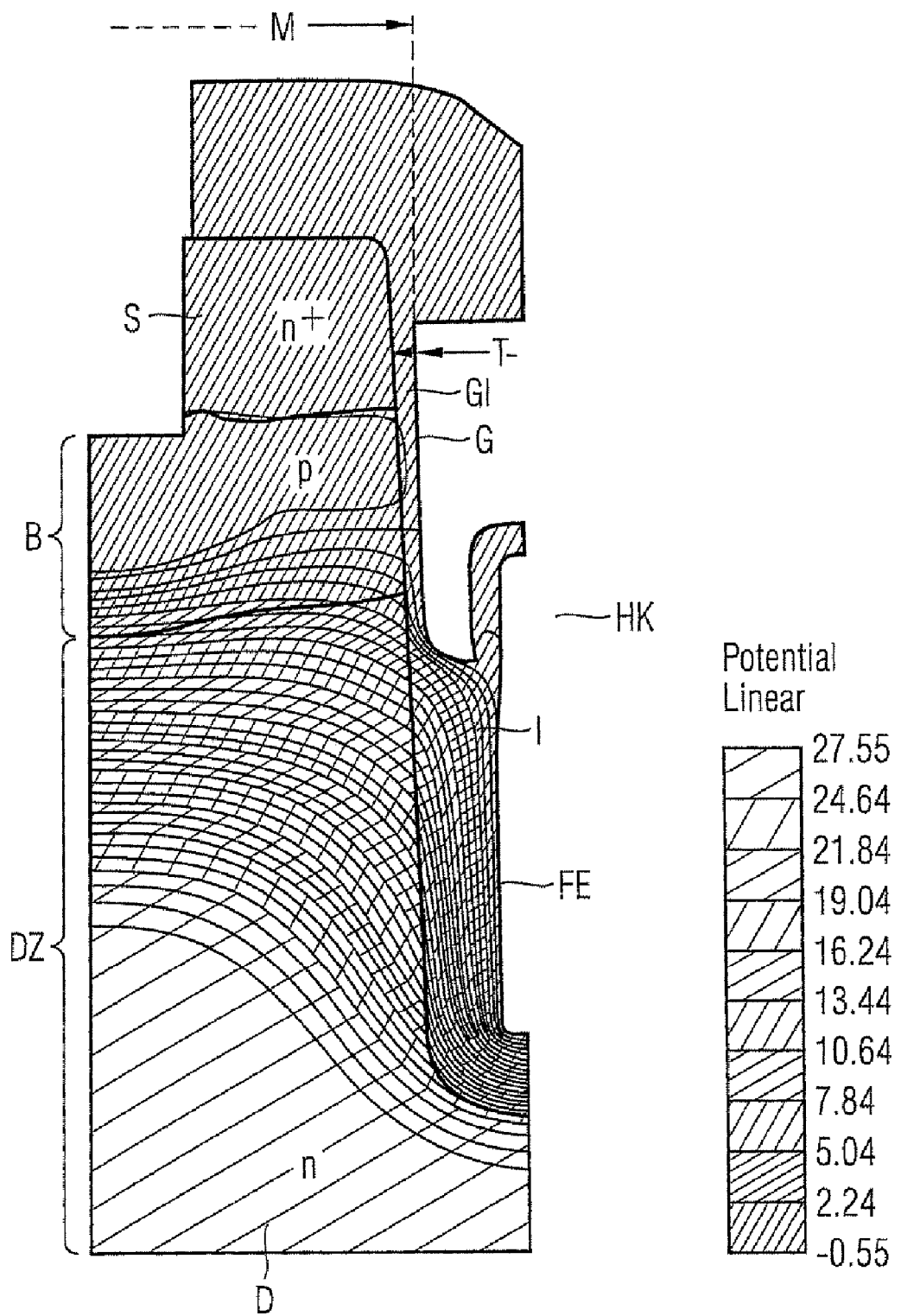
FIG. 1 illustrates a schematic cross-sectional view of one half of a trench transistor structure with a field electrode arrangement and simulated potential distribution.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a trench transistor structure with a field electrode arrangement in which the above problems with floating field electrodes are avoided. The present invention stabilizes the potential of the field electrode arrangement in a time range which is long in comparison with a time range for capacitive charge reversal processes within the field electrode arrangement.

In one embodiment, the invention provides a trench transistor structure having trenches in a transistor array which extend into a semiconductor body from a surface and which are isolated from one another by a mesa region. A drift zone is provided, formed in the mesa region for the purpose of picking up a reverse voltage, of a first conductivity type. A body region is provided, formed above the drift zone, of a second conductivity type, which is the opposite of the first conductivity type, having source regions of the first conductivity type which adjoin the trenches. A drain region is formed below the drift zone, of the first conductivity type. A gate electrode is formed in the trenches and is spaced from the mesa region by a gate insulation structure, for controlling the conductivity of channel regions which are formed between the source regions and the drift zone and which adjoin the trenches. A field electrode arrangement, arranged in the trenches, has at least one field electrode which is spaced from the mesa region and the gate electrode by an insulation structure and which is electrically conductive, where a voltage divider having at least one voltage divider element and at least one subvoltage tap is formed in the same or another semiconductor body or in a wiring area and the voltage divider provides a subvoltage, situated between the potential of the source regions and the potential of the drain region, on the at least one subvoltage tap, and a respective field electrode is electrically connected to a respective subvoltage tap.

By way of example, the semiconductor body can be made from a semiconductor wafer, particularly a silicon wafer, and can have an applied epitaxial layer, for example. In the case of a silicon wafer with an applied epitaxial layer, the trenches project from the surface into the epitaxial layer. The arrangement of trenches and mesa regions may be in strip form, for example, so that the transistor array is constructed from strips. Alternatively, however, other geometries for the arrangement of trenches and mesa regions are possible.

An electrical connection between the voltage divider via the at least one subvoltage tap to the at least one field electrode of the field electrode arrangement can be made using a metallization layer in the wiring area, for example. The wiring area designates an area which is formed above the semiconductor body and in which there normally run metallization layers or semiconductor layers, such as polysilicon layers, isolated by dielectrics. These layers formed in the wiring area are used, by way of example, to connect various components formed in the semiconductor body by means of conductive contact openings, for example contact plugs or vias, or else to form passive components such as resistors, for example in the form of a polysilicon layer resistor, and capacitances. By way of example, the subvoltage tap may be a contact-connectable conductive area, for example a contact-connectable metal area or else an area made of doped semiconductor material. The voltage divider element is an element which is formed in the semiconductor body or in the wiring area and across which, when a voltage is applied to the voltage divider, there is a voltage drop which can be forwarded using the subvoltage tap.

The first conductivity type may be n type and the second conductivity type may be p type. It is likewise conceivable to make the first conductivity type p type and the second conductivity type n type.

In one embodiment, the field electrode arrangement has a plurality of field electrodes which are arranged vertically below one another and which are spaced from one another by the insulation structure, the voltage divider device has a plurality of subvoltage taps which corresponds at least to the plurality of the field electrodes, where the subvoltage taps are electrically conductively connected to a respective field electrode, arranged at increasing depth in the semiconductor body, in the direction of decreasing potential difference between the subvoltage and the drain region. This means that the subvoltage tap whose potential is closest to the drain potential when a reverse voltage is applied between source and drain is connected to the lowest field electrode. Similarly, the subvoltage tap whose potential is closest to the source potential is electrically connected to the topmost field electrode in the field electrode arrangement. The voltage drop across the insulation structure laterally toward the drift region can thus be reduced in comparison with a field electrode which is at source potential. It is particularly beneficial if the number of subvoltage taps corresponds to the number of field electrodes.

In one embodiment of the trench transistor structure, the voltage divider elements are respectively in the form of a resistor, the voltage divider having series connected voltage divider elements, and a potential between interconnected voltage divider elements corresponds to the subvoltage from one of the subvoltage taps. In this case, the voltage divider, i.e. the division ratio, is in tune with the capacitive division ratio of the field electrodes.

This ensures that the field electrode potentials arising in the short time range dynamically, i.e. capacitively, are not shifted by the voltage divider in the longer time range. In this regard, the voltage divider is likewise proportioned such that the currents flowing via the voltage divider elements are a multiple of the possible leakage currents between the field electrodes. This prevents possible leakage currents from influencing the potential on the subvoltage taps and hence suspending the effect of the voltage divider. A resistive voltage divider of this kind is particularly if the field electrodes increase their potential evenly when a reverse voltage is applied between the source and drain.

In another embodiment, the resistors are respectively in the form of a semiconductor region in the semiconductor body or in the wiring area. In this context, the resistance value can be set using the specific resistance of the semiconductor region, i.e. using the dopant concentration in the semiconductor region. To define the semiconductor region acting as a resistor, the semiconductor region can be produced by means of implantation with dopant activation or by means of diffusion, for example. It is likewise conceivable to produce the resistor in the form of a deposited semiconductor layer in the wiring area.

The resistors have a respective resistance value of at least 100 MΩ. Such high resistance values prevent the voltage divider from decisively influencing the potential distribution over the field electrodes in the short time range, in which the potentials on the field electrodes usually arise capacitively. Similarly, resistance values in this order of magnitude provide the opportunity to produce the voltage divider in a manner which saves surface area.

In one embodiment, the resistors are formed from polysilicon. In this context, the resistors may be in the form of layer resistors in polysilicon in the wiring area, for example. It is likewise conceivable to produce the resistors from polysilicon in the trench as part of the field electrode or in a connection area of the field electrodes. Suitable conductivity of the polysilicon can be produced, by way of example, by adding dopants when producing the layer of polysilicon, for example by adding phosphorus to set a conductivity of the n conduction type or by adding boron to set a conductivity of the p conduction type.

In another embodiment, the voltage divider elements are in the form of zener diodes, the voltage divider having series connected zener diodes, and a potential between interconnected zener diodes corresponds to the subvoltage from one of the subvoltage taps. By way of example, the zener diodes may be formed in the wiring area or in the semiconductor body. In the semiconductor body, an area of the semiconductor body which is situated in the edge area or outside of the transistor array is suitable, for example. It is likewise conceivable to form the zener diodes within the trenches. To this end, these may be in a connection area of the field electrodes, for example, with the field electrodes, when formed as doped semiconductor regions, for their part being able to provide a region of the zener diodes produced as a an junction. The zener diodes are used to stabilize the voltage on the field electrodes on a time scale which is longer in comparison with the time scale for dynamic charge reversal processes upon change over of the potential between the drain and the source.

In another embodiment, the voltage divider elements are in the form of floating, spaced apart semiconductor zones, extending to the surface of the semiconductor body, of the second conductivity type in an area of the first conduction type which adjoins the drift region laterally in the semiconductor body, the semiconductor zones being electrically connected to a respective field electrode, arranged at increasing depth in the semiconductor body, via a subvoltage tap on the semiconductor zone with increasing spacing from the transistor array. The area adjoining the drift region outside of the transistor array is of the same conduction type as the drift zone; in particular, these areas may be formed by the same semiconductor layer. The potential in the adjoining semiconductor area therefore couples to a voltage applied between the source regions and the drain region.

Since the semiconductor zones of the second conduction type are situated in the semiconductor area of the first conduction type which adjoins the drift region and are not connected to an external potential, they are of floating design. To freeze the potential of a semiconductor zone, an increase in a reverse voltage between the drain and the source in the transistor array prompts the area laterally adjoining the drift region to be cleared out of freely moving charge carriers such as electrons and holes from the drift zone and prompts the resultant space charge zone, when hitting the semiconductor zone, to fix the latter's potential and thus the potential on the field electrode connected to the semiconductor zone. Since a field electrode at a greater depth is conductively connected to a respective semiconductor zone spaced further from the transistor array, a progressive rise in a reverse voltage between the drain and the source first of all results in the potential on a topmost field electrode being fixed as soon as the space charge zone reaches the semiconductor zone which is closest to the transistor array. If the space charge zone expands further as a result of a further increase in the reverse voltage and if it reaches the semiconductor zone which is closest to the semiconductor zone on the outside, the field electrode situated below the topmost field electrode has its potential fixed. This means that the potential on the topmost field electrode is closest to the potential of the source regions of the trench transistor, and the potential on the bottom most field electrode is closest to the potential on the drain of the transistor. Since this means that a voltage drop between the field electrodes and the laterally adjoining area of the drift zone is reduced in comparison with a field electrode situated at source potential, this allows a reduction in the thickness of the insulation structure, such as a field oxide. A voltage divider of this kind is suitable particularly if, when a reverse voltage is applied between the source and the drain, the field electrodes first of all remain at drain potential and are then progressively decoupled from the drain potential In one embodiment, compensation areas of the second conductivity type are formed in the drift zone. These compensation areas allow a drastic reduction in the turn-on resistance as a result of cancellation of the relationship between breakdown voltage and forward voltage in a conventional MOSFET, and result in a linear rise in the potentials on various field electrodes with increasing depth in the semiconductor body as a result of capacitive coupling in the time range of dynamic charge reversal processes. A resistive voltage divider is thus suitable for a trench transistor structure with compensation areas for preventing shifts in potential on the field electrodes in the longer time range, especially since the potentials on the field electrodes have already arisen beforehand in dynamically linearly rising fashion.

In order to express, in the description of the figures which follows, a graduation in the conductivity of various semiconductor zones in the figures, $n^+$ is used to designate a semiconductor zone of n conduction type with high conductivity, n is used to designate a semiconductor zone of n conduction type with moderate conductivity, and $n^-$ is used to designate a semiconductor zone of n conductivity type with low conductivity. The same applies to semiconductor regions of p conductivity type. The attributes high, moderate and low conductivity are to be interpreted relative to one another.

FIG. 1 illustrates a schematic cross-sectional view of one half of an n-channel DMOS trench transistor cell with a known field electrode arrangement. The cross-sectional view, illustrating just one half of a transistor cell, is coordinated as a cross section for a component simulation, which is why just areas which are relevant to the simulation are illustrated. The trench transistor cell has a trench T having a gate insulation structure GI and an insulation structure I formed on a side wall of the trench T, the gate insulation structure GI electrically insulating a gate electrode G, and the insulation structure I electrically insulating a field electrode FE, which is at the potential of the source electrode S, from a mesa region. In the mesa region M, a source region S of $n^+$-conduction type and a body region B of p-conduction type are formed adjoining the gate insulation structure. Below the body region B, adjoining the insulation structure I, there is a drift zone DZ of n-conduction type which adjoins a drain region D. A potential distribution based on an applied drain/source reverse voltage is illustrated using ruled equipotential lines. Almost the whole drain/source reverse voltage drops across the insulation structure I, which is in the form of a field oxide, for example. So as not to impair the withstand voltage and the service life of the insulation structure I, the latter needs to have a sufficient thickness. In the indicated example, in which the lateral extent of the trench T is less at the bottom than at its surface because of process conditions, the trench T adopts approximately one third of the cell pitch, i.e. cell spacing. The thickness of the insulation structure I for electrically insulating the field electrode FE in the trench T therefore makes a significant contribution to the size of the transistor cell in this known field electrode arrangement with a field electrode FE held at source potential.

FIG. 2a illustrates a schematic cross-sectional view of a detail from a transistor array in an embodiment of a trench transistor structure. Semiconductor regions such as the drift zone DZ, which have already been introduced in the above description of FIG. 1, are not described again below.

Formed below the gate electrode G is a respective field electrode arrangement FEA. The field electrode arrangement FEA has three electrically conductive field electrodes FE1, FE2 and FE3 which are positioned below one another and which are spaced and electrically insulated from one another and from the gate electrode G by an insulation structure I. The field electrodes FE1, FE2 and FE3 and the gate electrode G are formed from doped, i.e. conductive, polysilicon. Equally, they may also be made of a metal material or doped semiconductor material which is different from silicon.

FIG. 2b illustrates a schematic cross-sectional view of an area AB adjoining the drift zone DZ. Formed in the adjoining area AB, acting as edge termination, of n⁻conductivity type there is a voltage divider ST having voltage divider elements including a first semiconductor zone HZ1, a second semiconductor zone HZ2 and a third semiconductor zone HZ3 of p-conductivity type. The semiconductor zones HZ1, HZ2 and HZ3 extend as far as the surface OF of the semiconductor body HK and are conductively connected to a respective one of the field electrodes FE1, FE2 and FE3 in the transistor array TF via the subvoltage taps TA1, TA2, TA3. In this context, the first semiconductor zone HZ1 closest to the transistor array TF is conductively connected to a first field electrode FE1 arranged directly below the gate electrode G. Similarly, a second field electrode FE2 positioned below the first field electrode FE1 is conductively connected to the second semiconductor zone HZ2 positioned relative to the first semiconductor zone HZ1 on the outside, i.e. further away from the transistor array TF. An appropriate conductive connection is also present between a third field electrode FE3 and the third semiconductor zone HZ3.

Formed between the adjacent semiconductor zones and between the first semiconductor zone HZ1 and the body region B there is a respective auxiliary zone of p⁻conductivity type. Upon application of a reverse voltage between the source regions S and the drain D, the adjoining area AB is cleared out of freely moving charge carriers laterally through the formation of a space charge zone RLZ identified in the form of equipotential lines $V_1$ $V_2$ and $V_3$. In this context, the auxiliary zones are also cleared out and are depleted of freely moving charge carriers. The space charge zone first of all expands from the transistor array TF to the first semiconductor zone HZ1. When the latter is reached, its potential and hence the potential on the first field electrode FE1 are fixed. As the reverse voltage increases further, the second and third field electrodes FE2, FE3 are progressively fixed at correspondingly higher potentials.

When the trench transistor structure is turned on again from the off-state mode, the auxiliary zones provide a conductive connection between the semiconductor zones HZ1, HZ2, HZ3 and the body region B, as a result of which the field electrodes FE1, FE2 and FE3 can discharge. This stems from the fact that the auxiliary zones connect the semiconductor zones HZ1, HZ2 and HZ3 conductively to the body region B when the trench transistor structure is turned on again.

A conductive connection between the semiconductor zones HZ1, HZ2, HZ3 and the field electrodes FE1, FE2 and FE3 is respectively designated as a line between FIGS. 2a) and 2b).

Figure 3:
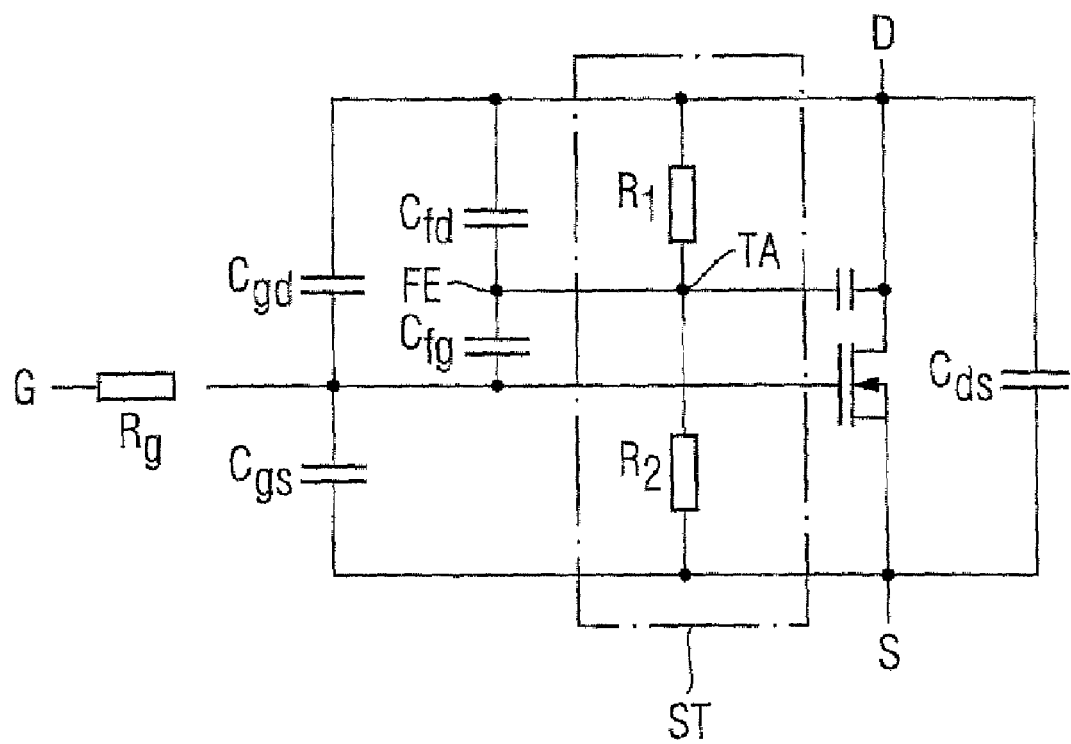
FIG. 3 illustrates a schematic equivalent circuit diagram of an embodiment of the trench transistor structure with a resistive voltage divider.

FIG. 3 illustrates a schematic equivalent circuit diagram of a trench transistor structure in a further embodiment. Between the transistor connections for source S, gate electrode G and drain D, coupling capacitances $C_{gd}$ (between gate electrode G and drain D), $C_{gs}$ (between gate electrode G and source S) and $C_{ds}$ (between drain and source) are included. A field electrode FE is designated by a coupling capacitance $C_{fd}$ for the drain D and also the coupling capacitance $C_{fg}$ for the gate electrode. The voltage divider ST has two voltage divider elements R1 and R2 in the form of resistors, with a subvoltage which corresponds to the potential between the resistors being connected to the field electrode FE via a subvoltage tap TA. A resistor $R_g$ designates a gate electrode supply resistance. It should be pointed out that the series circuit including $C_{fg}$ and $C_{fd}$ is situated in parallel with the feedback capacitance $C_{gd}$ of the transistor structure, and the feedback capacitance $C_{gd}$ can therefore be impaired depending on values of $C_{fg}$ and $C_{fd}$. To prevent this, a further field electrode connected to the source with low impedance can be arranged in the trench between the gate electrode G and the topmost field electrode of the field electrode arrangement (for example FE1 in FIG. 2a).

In FIG. 4, the left-hand figure section a) illustrates a schematic cross-sectional view of one cell half of an n-channel DMOS trench transistor with a blocking strength of approximately 30 V, a known field electrode arrangement (i.e. the field electrode is at source potential) and a pitch of 1.5 μm. The distribution of the equipotential lines, predominantly situated in the drift zone DZ, on account of the applied reverse voltage of 30 V is illustrated in ruled form. Almost the entire reverse voltage drops across the insulation structure I, which is in the form of a field oxide, for example.

The right-hand figure section 4b) schematically illustrates the cell half of the n-channel DMOS trench transistor with a blocking strength of 30 V, for example if the embodiment of the voltage divider illustrated in FIG. 3 is integrated (not illustrated). In this case, the resistors $R_1$ and $R_2$ are 22 GΩ and 8 GΩ, for example, which means that when the reverse voltage of 30 V is applied a subvoltage of 8 V is supplied to the field electrode FE via the subvoltage tap TA (see FIG. 3). On account of the now smaller voltage drop across the insulation structure I, said structure can be made thinner while maintaining reliability requirements and the blocking strength of the component. In the example indicated, the pitch can be reduced to 1.3 μm. The higher density of transistor cells per chip area which can be achieved as a result of the smaller pitch results in an improvement in the surface area specific turn-on resistance $R_{on}$·A of approximately 8% in comparison with the known embodiment of the trench transistor with a field electrode at source potential.

Figure 5:
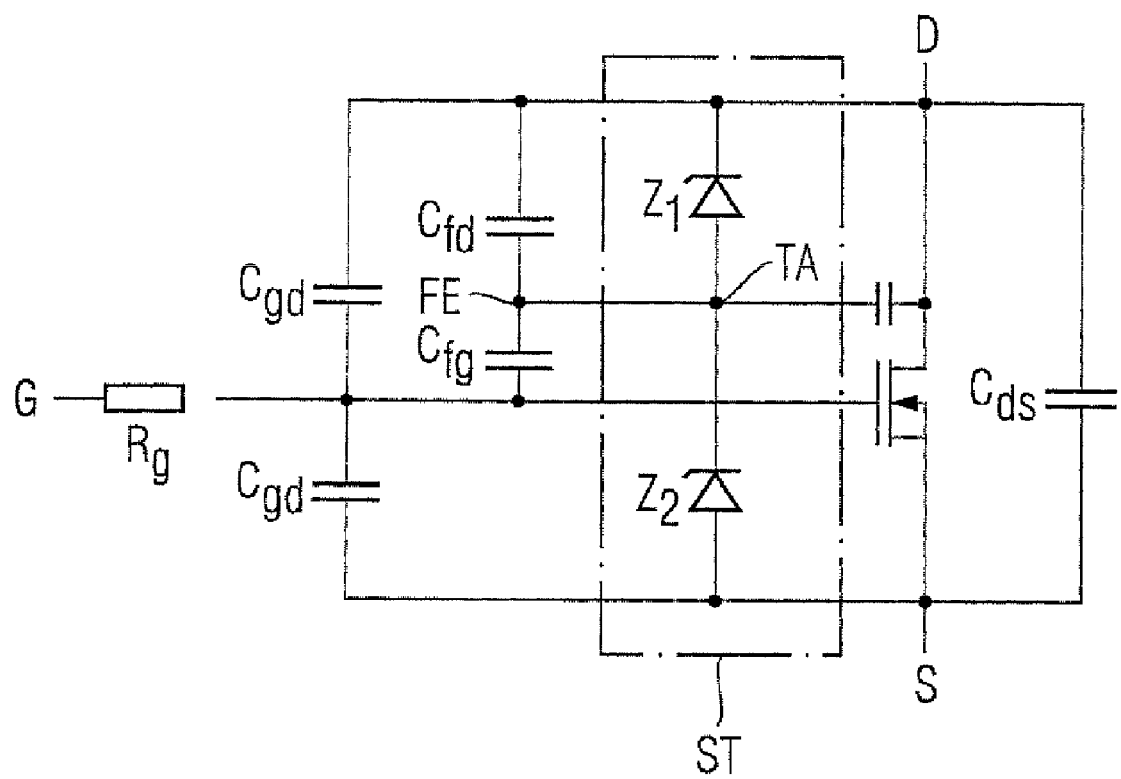
FIG. 5 illustrates a schematic equivalent circuit diagram of an embodiment of the trench transistor structure with a voltage divider constructed from zener diodes.

FIG. 5 illustrates a schematic equivalent circuit diagram of a trench transistor structure in a further embodiment. The schematic equivalent circuit diagram of the trench transistor structure is the same as that in the embodiment from FIG. 3, apart from the voltage divider, for which reason the parts which correspond are not described again. However, the voltage divider ST is not produced with voltage divider elements in the form of resistors $R_1$, $R_2$, as illustrated in FIG. 3, but rather has series connected zener diodes $Z_1$ and $Z_2$ as voltage divider elements. The zener diodes may have different breakdown voltages from one another. The subvoltage tap TA taps off a subvoltage formed between the zener diodes $Z_1$ and $Z_2$.

Figure 6:
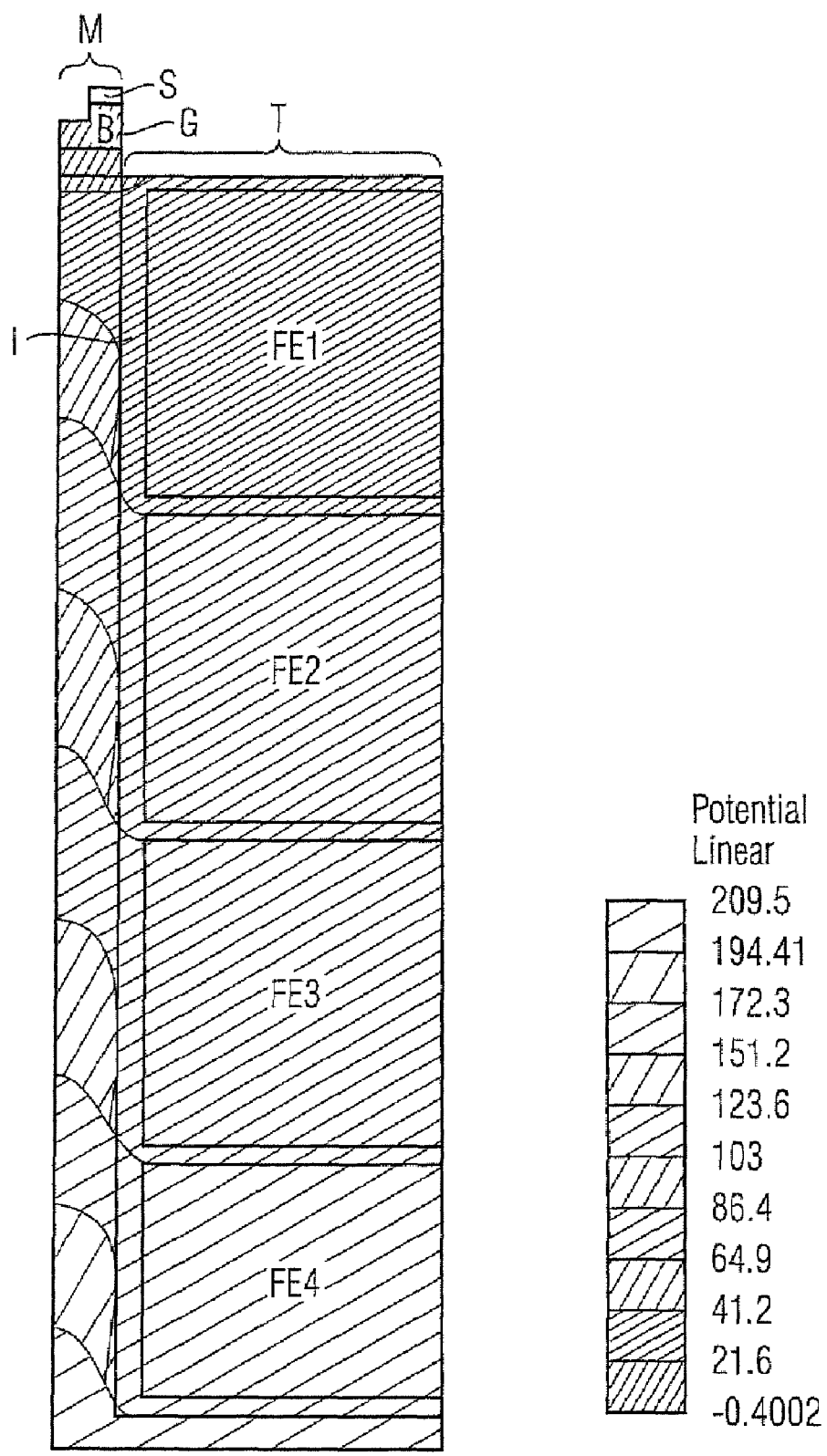
FIG. 6 illustrates a schematic cross-sectional view of one trench transistor cell half with compensation regions and also simulated dynamic potential distribution.

FIG. 6 illustrates a schematic cross-sectional view of a trench transistor structure with compensation areas (not illustrated). Arranged within the trench T are four field electrodes FE1, FE2, FE3 and FE4 which are arranged below one another and which are electrically insulated from one another and from the mesa region M by an insulation structure I. The field electrodes are not electrically connected to a voltage divider. However, a voltage drop from the body region B into the depth of the drift zone DZ increases linearly on account of the compensation areas (not illustrated), which is illustrated by the equipotential areas (illustrated by shading and ascertained for each component simulation) in the component's off-state mode. Hence, it is of particular advantage in the case of this trench transistor structure to connect the field electrodes conductively to subvoltage taps of a resistive voltage divider in order to prevent the potentials on the field electrodes from being shifted in the time range following dynamic coupling processes, i.e. capacitive coupling.

Figure 7:
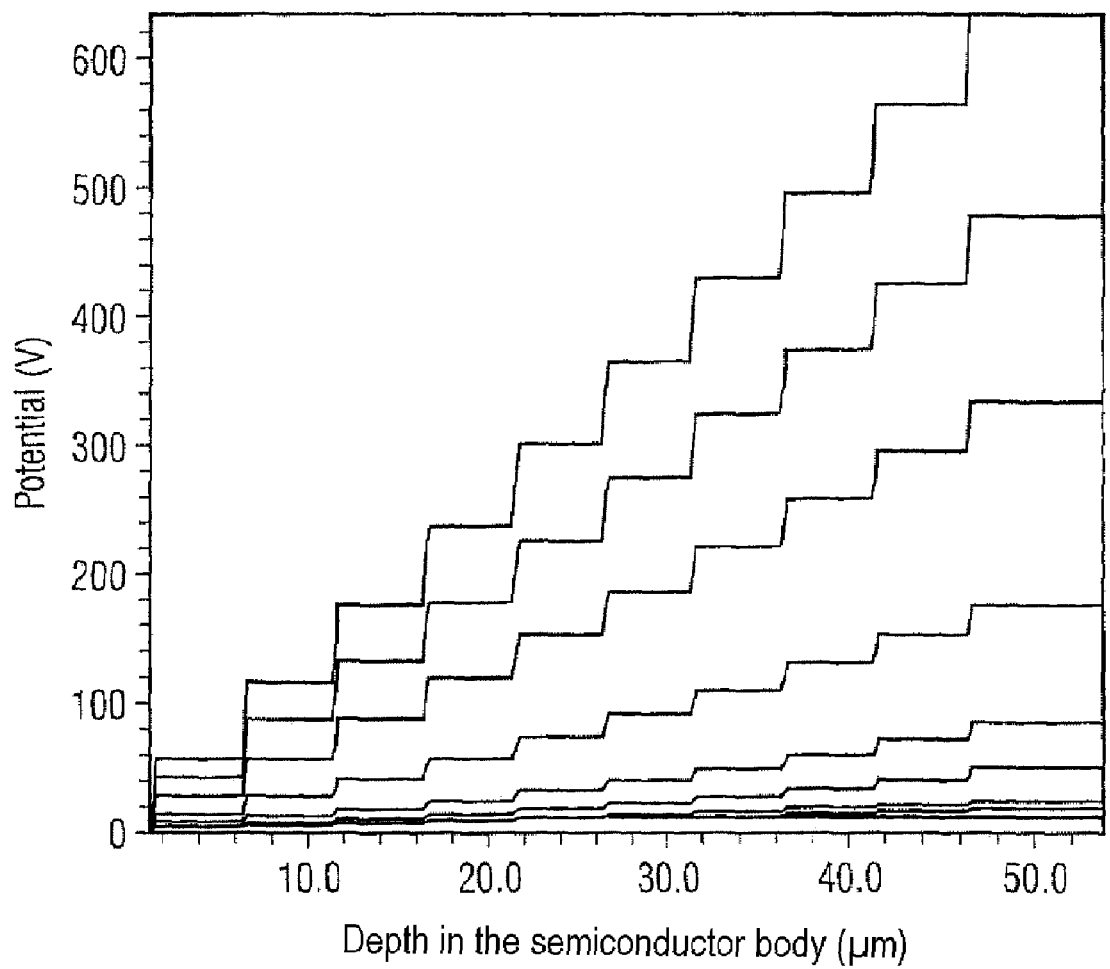
FIG. 7 illustrates a graph with a simulated dynamic potential profile into the depth of the semiconductor body in a trench transistor structure with compensation regions.

FIG. 7 illustrates a graph with a simulated potential distribution on the field electrodes of a trench transistor structure with compensation areas. The graph illustrates the potential across the depth in the semiconductor body at different times when a reverse voltage is run up between the source and the drain. The processes in the potential profile identify a transition from a field electrode to an adjacent field electrode. The constant process sizes portray the linear potential profile with increasing depth in the semiconductor body and illustrate the suitability of a resistive voltage divider for stabilizing the potentials on the field electrodes.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A trench transistor comprising:
   trenches in a transistor array isolated from one another by a mesa region;
   a field electrode arrangement, arranged in the trenches, having at least one field electrode which is spaced from the mesa region and the gate electrode by an insulation structure and which is electrically conductive;
   a voltage divider having at least one voltage divider element and at least one subvoltage tap is formed in the same or another semiconductor body or in a wiring area, the voltage divider providing a subvoltage, situated between the potential of the source regions and the potential of the drain region, on the at least one subvoltage tap;
   a respective field electrode is electrically connected to a respective subvoltage tap, and
   wherein the voltage divider elements are in the form of floating spaced apart semiconductor zones, extending to the surface of the semiconductor body, of the second conduction type in the semiconductor body, the semiconductor zones being electrically connected to a respective field electrode, arranged at increasing depth in the semiconductor body, via a subvoltage tap on the semiconductor zone with increasing spacing from the transistor array.

2. The trench transistor structure as claimed in claim 1, wherein the field electrode arrangement has a plurality of field electrodes which are arranged vertically below one another and which are spaced from one another by the insulation structure;
   the voltage divider has a plurality of subvoltage taps which corresponds at least to the plurality of the field electrodes; and
   the subvoltage taps are electrically conductively connected to a respective field electrode, arranged at increasing depth in the semiconductor body, in the direction of decreasing potential difference between the subvoltage and drain region.

3. The trench transistor structure as claimed in claim 2, wherein
   the voltage divider elements are respectively in the form of a resistor, the voltage divider having series connected voltage divider elements; and
   a potential between interconnected voltage divider elements corresponds to the subvoltage from one of the subvoltage taps.

4. The trench transistor structure as claimed in claim 3, wherein the resistors are respectively in the form of a semiconductor region in the semiconductor body or in the wiring area.

5. The trench transistor structure as claimed in claim 3, wherein the resistors have a respective resistance value of at least 100 MΩ.

6. The trench transistor structure as claimed in claim 3, wherein the resistors are formed from polysilicon.

7. The trench transistor structure as claimed in claim 1, wherein
   the voltage divider elements are in the form of zener diodes, the voltage divider having series connected zener diodes; and
   a potential between interconnected zener diodes corresponds to the subvoltage from one of the subvoltage taps.

8. The trench transistor as claimed in claim 1, comprising:
   a drift zone, formed in the mesa region, of a first conductivity type;
   a body region, formed above the drift zone, of a second conductivity type, having source regions of the first conductivity type;
   a drain region, formed below the drift zone of the first conductivity type;
   a gate electrode, which is formed in the trenches and which is spaced from the mesa region by a gate insulation structure.

9. The trench transistor structure as claimed in claim 8, comprising compensation areas of the second conduction type in the drift zone.

10. A trench transistor comprising:
    a plurality of trenches in a transistor array extending into a semiconductor body from a surface and which are isolated from one another by a mesa region;
    a drift zone, formed in the mesa region for the purpose of picking up a reverse voltage, of a first conductivity type;
    a body region, formed above the drift zone, of a second conductivity type, which is the opposite of the first conductivity type, having source regions of the first conductivity type which adjoin the trenches;
    a drain region, formed below the drift zone, of the first conductivity type;
    a gate electrode, which is formed in the trenches and which is spaced from the mesa region by a gate insulation structure, for controlling the conductivity of channel regions which are formed between the source regions and the drift zone and which adjoin the trenches;
    a field electrode arrangement, arranged in the trenches, having at least one field electrode which is spaced from the mesa region and the gate electrode by an insulation structure and which is electrically conductive, wherein
    a voltage divider having at least one voltage divider element and at least one subvoltage tap is formed in the same or another semiconductor body or in a wiring area, the voltage divider providing a subvoltage, situated between the potential of the source regions and the potential of the drain region, on the at least one subvoltage tap;
    a respective field electrode is electrically connected to a respective subvoltage tap, configured to stabilize potentials on a longer time scale than a dynamic charge reversal process; and wherein the voltage divider elements are in the form of floating, spaced apart semiconductor zones, extending to the surface of the semiconductor body, of the second conduction type in the semiconductor body, the semiconductor zones being electrically connected to a respective field electrode, arranged at increasing depth in the semiconductor body, via a subvoltage tap on the semiconductor zone with increasing spacing from the transistor array.

11. The trench transistor structure as claimed in claim 10, wherein the field electrode arrangement has a plurality of field electrodes which are arranged vertically below one another and which are spaced from one another by the insulation structure;

the voltage divider has a plurality of subvoltage taps which corresponds at least to the plurality of the field electrodes; where the subvoltage taps are electrically conductively connected to a respective field electrode, arranged at increasing depth in the semiconductor body, in the direction of decreasing potential difference between the subvoltage and the drain region.

12. The trench transistor structure as claimed in claim 11, wherein the voltage divider elements are respectively in the form of a resistor, the voltage divider having series connected voltage divider elements; and a potential between interconnected voltage divider elements corresponds to the subvoltage from one of the subvoltage taps.

13. The trench transistor structure as claimed in claim 12, wherein the resistors are respectively in the form of a semiconductor region in the semiconductor body or in the wiring area.

14. The trench transistor structure as claimed in claim 12, wherein the resistors have a respective resistance value of at least 100 MΩ.

15. The trench transistor structure as claimed in claim 12, wherein the resistors are formed from polysilicon.

16. The trench transistor structure as claimed in claim 10, wherein the voltage divider elements are in the form of zener diodes, the voltage divider having series connected zener diodes; and a potential between interconnected zener diodes corresponds to the subvoltage from one of the subvoltage taps.

17. The trench transistor structure as claimed in claim 10, comprising compensation areas of the second conduction type in the drift zone.

18. A trench transistor structure comprising:

trenches in a transistor array which extend into a semiconductor body from a surface and which are isolated from one another by a mesa region;

a drift zone, formded in the mesa region for the purpose of picking up a reverse voltage, of a first conductivity type;

a body region, formed above the drift zone, of a second conductivity type, which is the opposite of the first conductivity type, having source regions of the first conductivity type which adjoin the trenches;

a drain region, formed below the drift zone, of the first conductivity type;

a gate electrode, which is formed in the trenches and which is spaced from the mesa region by a gate insulation structure, for controlling the conductivity of channel regions which are formed between the source regions and the drift zone and which adjoin the trenches;

a field electrode arrangement, arranged in the trenches having at least one field electrode which is spaced from the mesa region and the gate electrode by an insulation structure and which is electrically conductive, a voltage divider having at least one voltage divider element and at least one subvoltage tap in the same or another semiconductor body or in a wiring area, the voltage divider providing a subvoltage, situated between the potential of the source regions and the potential of the drain region, on the at least one subvoltage tap, and a respective field electrode being electrically connected to a respective subvoltage tap; wherein the voltage divider elements are in the form of floating, spaced apart semiconductor zones, extending to the surface of the semiconductor body, of the second conduction type in the semiconductor body, the semiconductor zones being electrically connected to a respective field electrode, arranged at increasing depth in the semiconductor body, via a subvoltage tap on the semiconductor zone with increasing spacing from the transistor array.

* * * * *